United States Patent
Shurhay

(10) Patent No.: US 11,968,798 B2
(45) Date of Patent: Apr. 23, 2024

(54) TRANSPORT CASTER ASSEMBLY FOR A DATA CENTER CABINET

(71) Applicant: Panduit Corp., Tinley Park, IL (US)

(72) Inventor: Mark Shurhay, Western Springs, IL (US)

(73) Assignee: Panduit Corp., Tinley Park, IL (US)

( * ) Notice: Subject to any disclaimer, the term of this patent is extended or adjusted under 35 U.S.C. 154(b) by 373 days.

(21) Appl. No.: 17/305,083

(22) Filed: Jun. 30, 2021

(65) Prior Publication Data

US 2023/0007805 A1 Jan. 5, 2023

(51) Int. Cl.
| H05K 7/00 | (2006.01) |
| B60B 33/00 | (2006.01) |
| B60B 33/06 | (2006.01) |
| H05K 7/18 | (2006.01) |

(52) U.S. Cl.
CPC ........... *H05K 7/18* (2013.01); *B60B 33/0005* (2013.01); *B60B 33/066* (2013.01)

(58) Field of Classification Search
CPC ...... H05K 7/18; B60B 33/0005; B60B 33/066
USPC ....................................................... 280/79.3
See application file for complete search history.

(56) References Cited

U.S. PATENT DOCUMENTS

| 4,249,282 A | 2/1981 | Little |
| 5,372,262 A | 12/1994 | Benson et al. |
| 5,375,294 A | 12/1994 | Garrett |
| 5,428,866 A | 7/1995 | Aschow |
| 5,980,008 A | 11/1999 | Stoever |
| 6,109,625 A * | 8/2000 | Hewitt ................... F16M 11/22 280/43.24 |
| 6,162,004 A * | 12/2000 | Hanakawa .............. B62B 3/002 414/389 |
| 6,507,975 B2 | 1/2003 | Maupin et al. |
| 6,725,501 B2 * | 4/2004 | Harris ................ B60B 33/0039 16/31 R |
| 6,831,225 B2 * | 12/2004 | Chandler ............. H05K 7/1457 361/600 |
| 7,065,933 B2 | 6/2006 | Chandler |
| 7,374,186 B2 | 5/2008 | Mason et al. |
| 7,478,819 B1 | 1/2009 | Boraas et al. |

(Continued)

OTHER PUBLICATIONS

Solejazz Workbench Caster kit 880 LBS Capacity 3" Heavy Duty Retractable Workbench Caster All Steel Construction Urethane Wheels, Bonus Install Template, Pack of 4; https://www.amazon.com/SOLEJAZZ-Workbench-Capacity-Retractable-Construction/dp/B087PSWWXM; printed on Jun. 30, 2021 (11 pgs.).

*Primary Examiner* — Hau V Phan
(74) *Attorney, Agent, or Firm* — Christopher S. Clancy; James H. Williams; Aimee E. McVady

(57) ABSTRACT

A removable transport caster assembly secured to side to side beams or front to back beams in a data center cabinet in a data center. The removable transport caster assembly is temporarily installed on the cabinet to enable the cabinet to be relocated to another location in the data center. The removable transport caster assembly includes a transport caster and a transport caster bracket secured to the transport caster. The transport caster has a mounting plate, a mounting bracket extending from the mounting plate, a lifting plate pivotally connected to the mounting plate, a lifting lever pivotally connected to the mounting bracket and a wheel assembly. The transport caster bracket secures the transport caster to the cabinet when relocation of the cabinet is desired.

8 Claims, 20 Drawing Sheets

(56) References Cited

U.S. PATENT DOCUMENTS

| | | | |
|---|---|---|---|
| 7,540,509 B1 | 6/2009 | Boraas et al. | |
| 7,891,051 B2* | 2/2011 | Chou | B60B 33/021 |
| | | | 16/31 R |
| 8,141,885 B2 | 3/2012 | Fan et al. | |
| 8,544,860 B2* | 10/2013 | Fan | H05K 7/1488 |
| | | | 248/128 |
| 8,787,023 B2* | 7/2014 | Lewis, II | B25B 5/104 |
| | | | 361/829 |
| 8,901,418 B2* | 12/2014 | Walker | H05K 7/1491 |
| | | | 211/26 |
| 8,985,345 B2 | 3/2015 | Fan et al. | |
| 9,090,125 B2* | 7/2015 | Block | B60B 33/021 |
| 9,743,543 B2 | 8/2017 | Anderson et al. | |
| 9,943,003 B2* | 4/2018 | Segroves | H05K 7/1488 |
| 10,172,255 B2* | 1/2019 | Eckberg | B60B 33/0063 |
| 2004/0020008 A1* | 2/2004 | Harris | B60B 33/0049 |
| | | | 16/35 R |
| 2005/0006155 A1 | 1/2005 | Lenkman | |
| 2015/0069888 A1* | 3/2015 | Lewis, II | H05K 5/0217 |
| | | | 312/223.1 |

\* cited by examiner

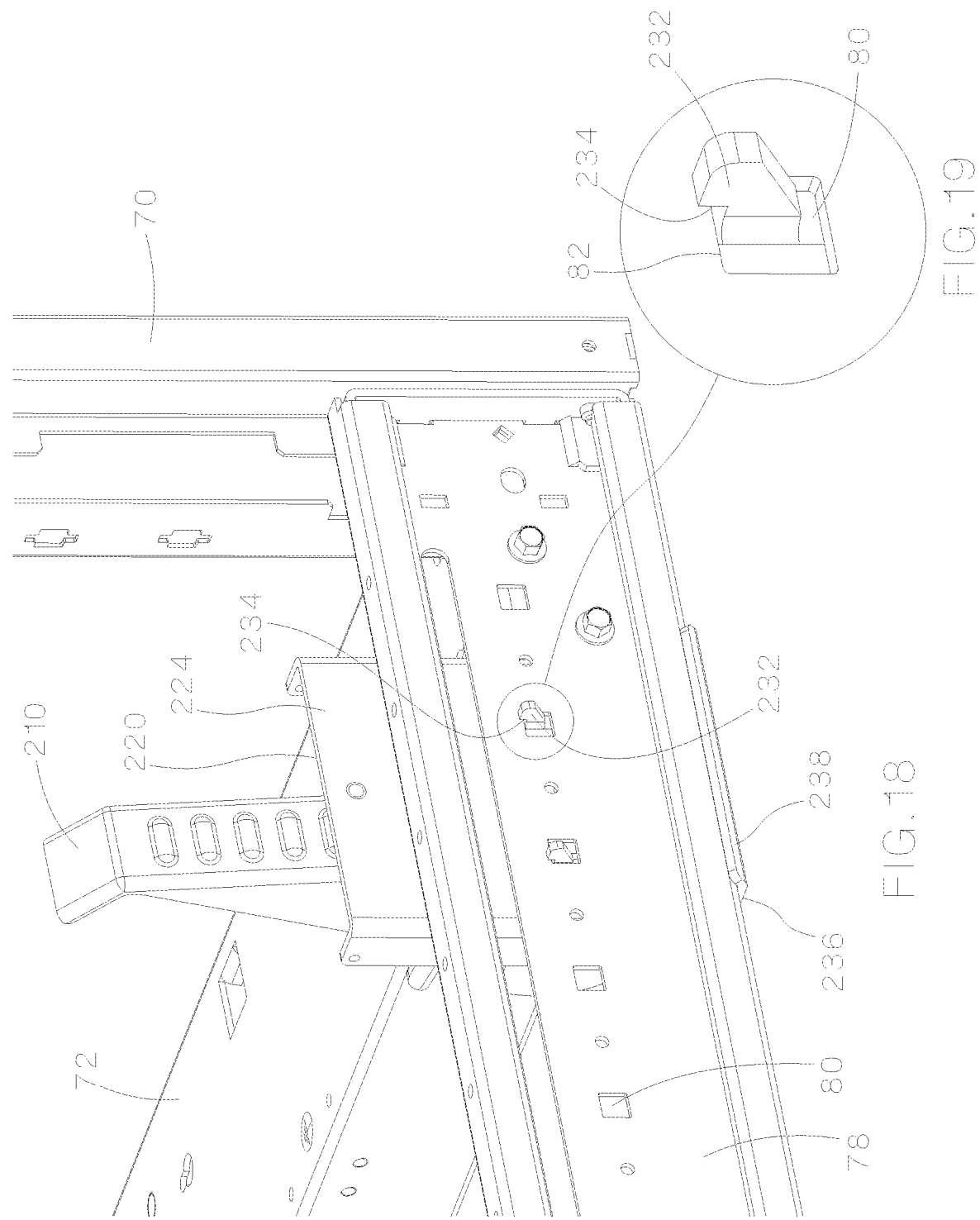

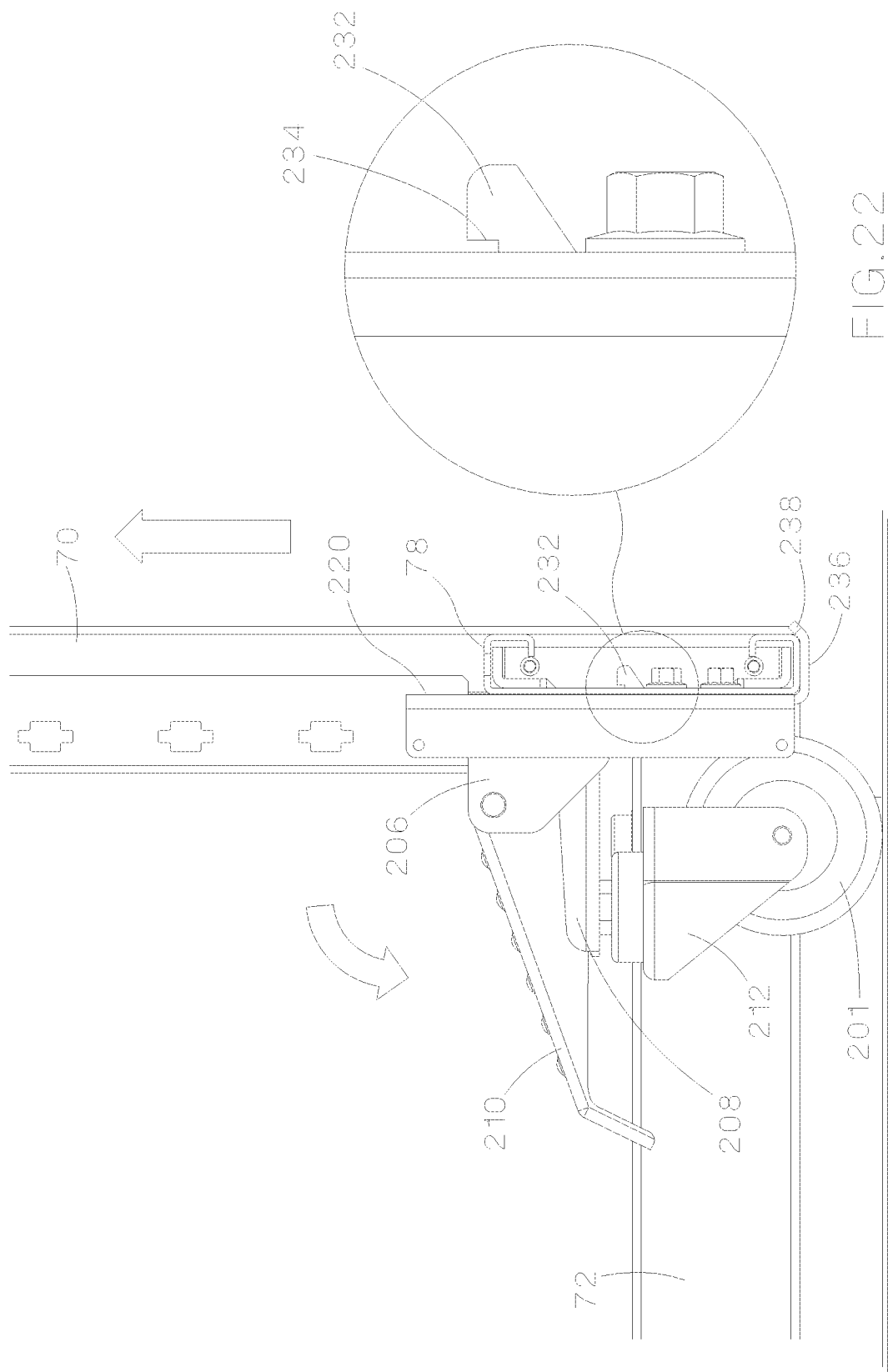

TRANSPORT CASTER ASSEMBLY FOR A DATA CENTER CABINET

FIELD OF THE INVENTION

The present invention relates to a transport caster, and more particularly to a removable transport caster assembly for a data center cabinet.

BACKGROUND OF THE INVENTION

Data center cabinets typically include casters to allow the cabinet to be easily rolled around on a data center floor. Once the cabinet is in the desired position, the cabinet is usually raised off of the casters by extending leveling legs. FIGS. 1 and 2, illustrate a data center cabinet with fixed casters located under the cabinet. Once the leveling legs are set, the cabinet remains in position in the data center. Thus, the casters are typically only used for a short time over the life of a cabinet. The fixed casters secured to the cabinet add to the overall cost of each cabinet. As a result, eliminating the fixed casters would reduce the overall cost of the data center cabinet.

One solution is to install removable transport casters on cabinets instead of the fixed casters. Removable transport casters can be installed on the data center cabinets to relocate the cabinets. After the cabinet is moved, then the casters can be removed from the cabinet. The removable transport casters enable a customer to purchase only one set of transport casters and install them only when cabinets in the data center are required to be moved to a different location. Typically, transport casters are difficult to install as the installation of the casters require the cabinet to be lifted off of the ground for installation.

As a result, it is desirable to provide removable transport casters that are easily installed on the cabinets in a data center.

SUMMARY OF THE INVENTION

The present invention is directed to a removable transport caster assembly used to position a cabinet in a data center. The removable transport caster assembly includes A transport caster and a transport caster bracket secured to the transport caster. The transport caster includes a mounting plate, a mounting bracket extending from the mounting plate, a lifting plate pivotally connected to the mounting plate, a lifting lever pivotally connected to the mounting bracket and a wheel assembly. The transport caster bracket secures the transport caster to the cabinet.

The present invention is also directed to a data center cabinet defined by a base frame with front vertical posts connected by side to side beams and back vertical posts connected by side to side beams. Front to back beams connect the front vertical posts to the back vertical posts. Transport caster assemblies are removably secured to the side to side beams or the front to back beams to facilitate the relocation of the data center cabinets in a data center.

BRIEF DESCRIPTION OF THE DRAWINGS

FIG. 18 is a rear perspective view of the transport caster assembly of FIG. 17.

FIG. 19 is a perspective view of the hook of the transport caster assembly of FIG. 18.

FIG. 21 is a side view of the transport caster assembly of FIG. 18 with the lifting lever in a down position.

FIG. 22 is a side view of the hook of the transport caster assembly of FIG. 21.

DETAILED DESCRIPTION

Figure 1:
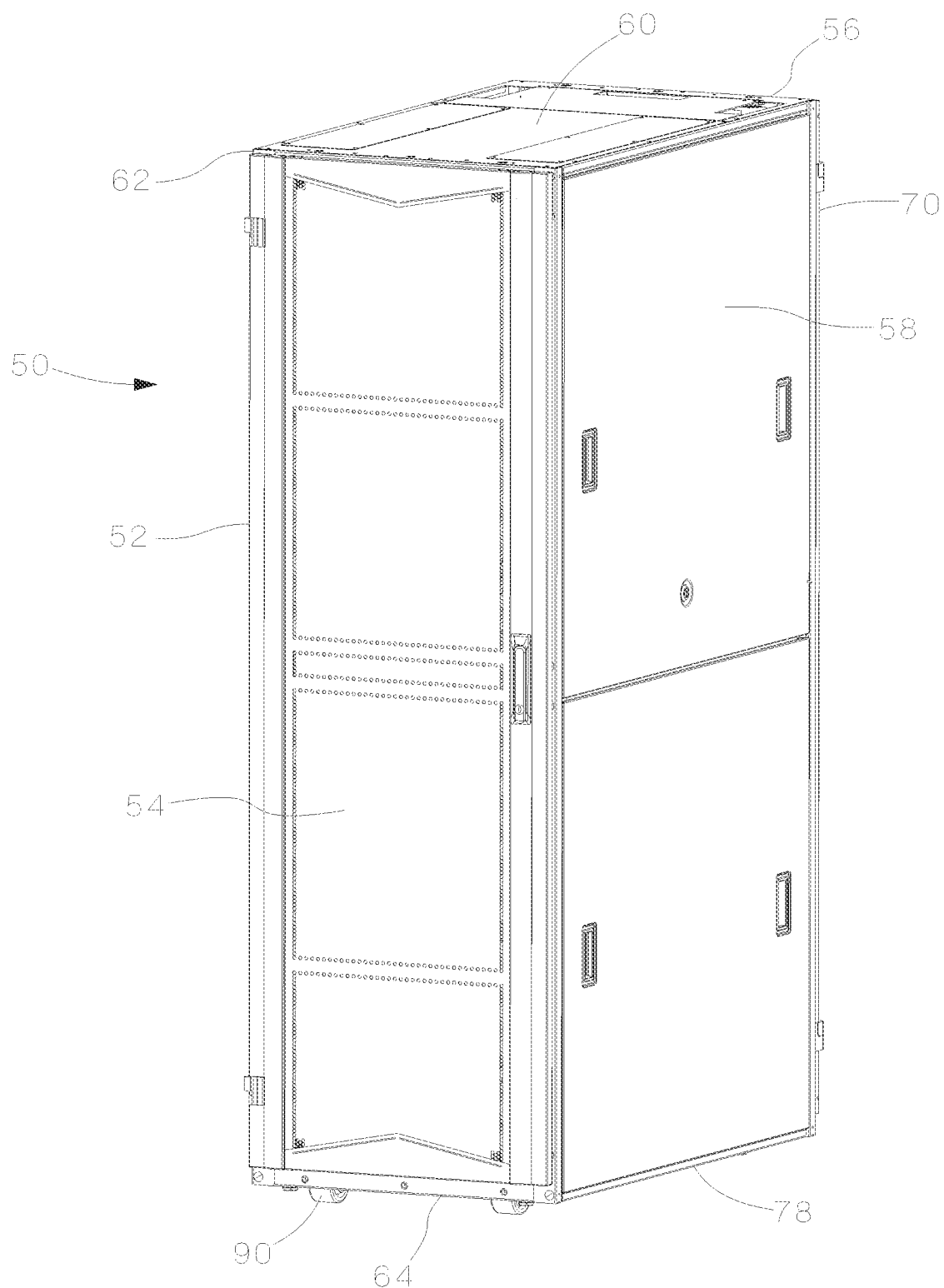
FIG. 1 is a perspective view of a data center cabinet with fixed casters located under the cabinet.
Figure 2:
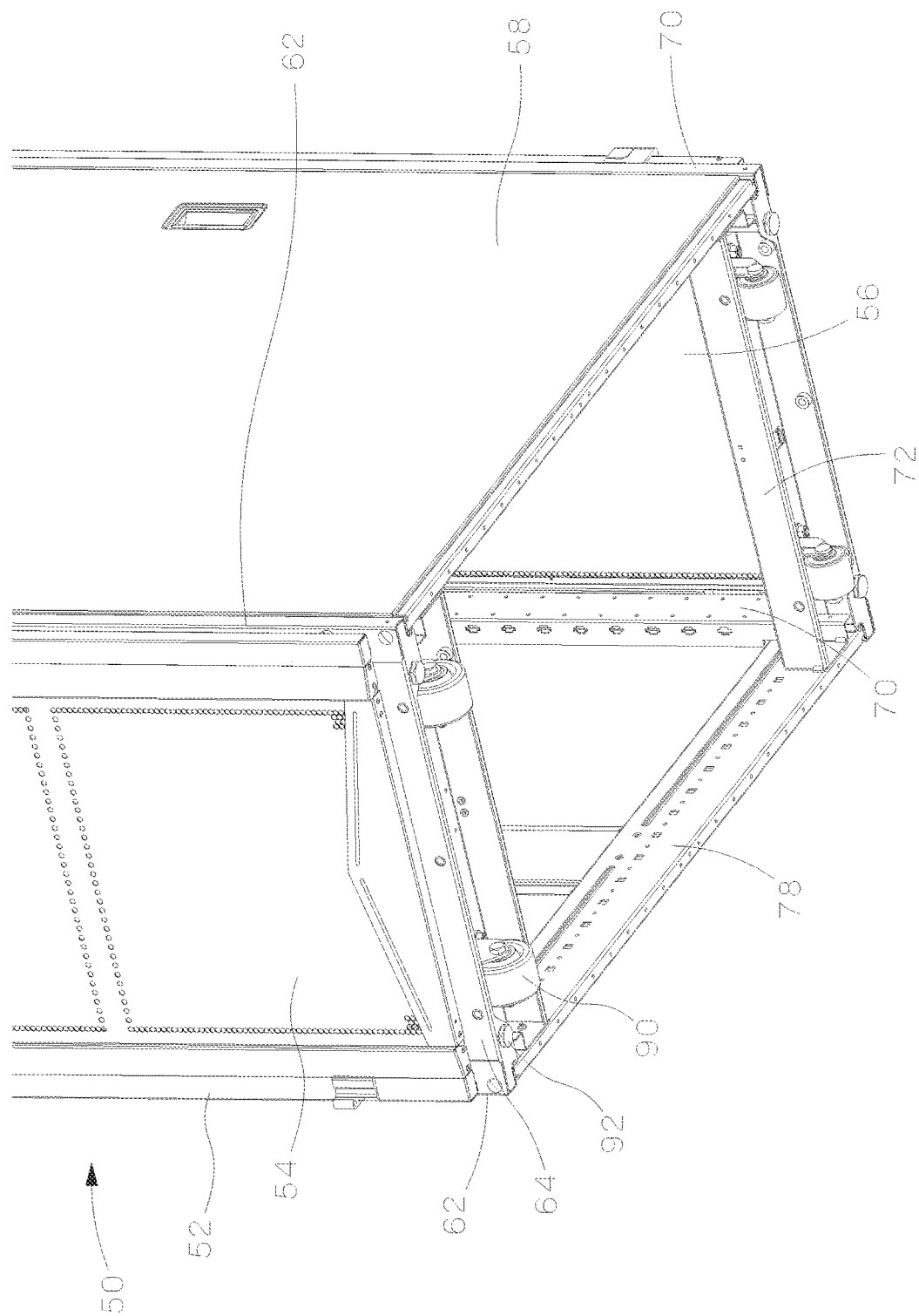
FIG. 2 is a bottom perspective view of the data center cabinet of FIG. 1.

FIGS. 1 and 2 illustrate an example data center cabinet 50 with a base frame 52, a front door 54, a rear door 56, side panels 58, and a top cap 60. The base frame 52 includes a pair of front vertical posts 62, side to side beams 64 that connect the front vertical posts 62, a pair of back vertical posts 70, and side to side beams 72 that connect the back vertical posts 70. The data center cabinet 50 includes front to back beams 78 that connect the front vertical posts 62 to the back vertical posts 70. The data center cabinet 50 also has fixed casters 90 and extendible leveling legs 92. When the cabinet 50 is required to be relocated, the leveling legs 92 are raised so the cabinet may be rolled on the fixed casters 90 to the new location. Once positioned, the leveling legs 92 are extended to maintain the cabinet 50 in a fixed position.

FIGS. 3-22 illustrate removable transport caster assemblies 100, 200 of the present invention that can be installed on a data center cabinet when it is necessary to relocate the cabinet in the data center. FIGS. 3-13 illustrate removable transport caster assembly 100 designed to be secured to the side to side beams 64, 72 in a data center cabinet 50. FIGS. 14-22 illustrates alternative removable transport caster assembly 200 designed to be secured to the front to back beams 78 in the data center cabinet 50.

Figure 3:
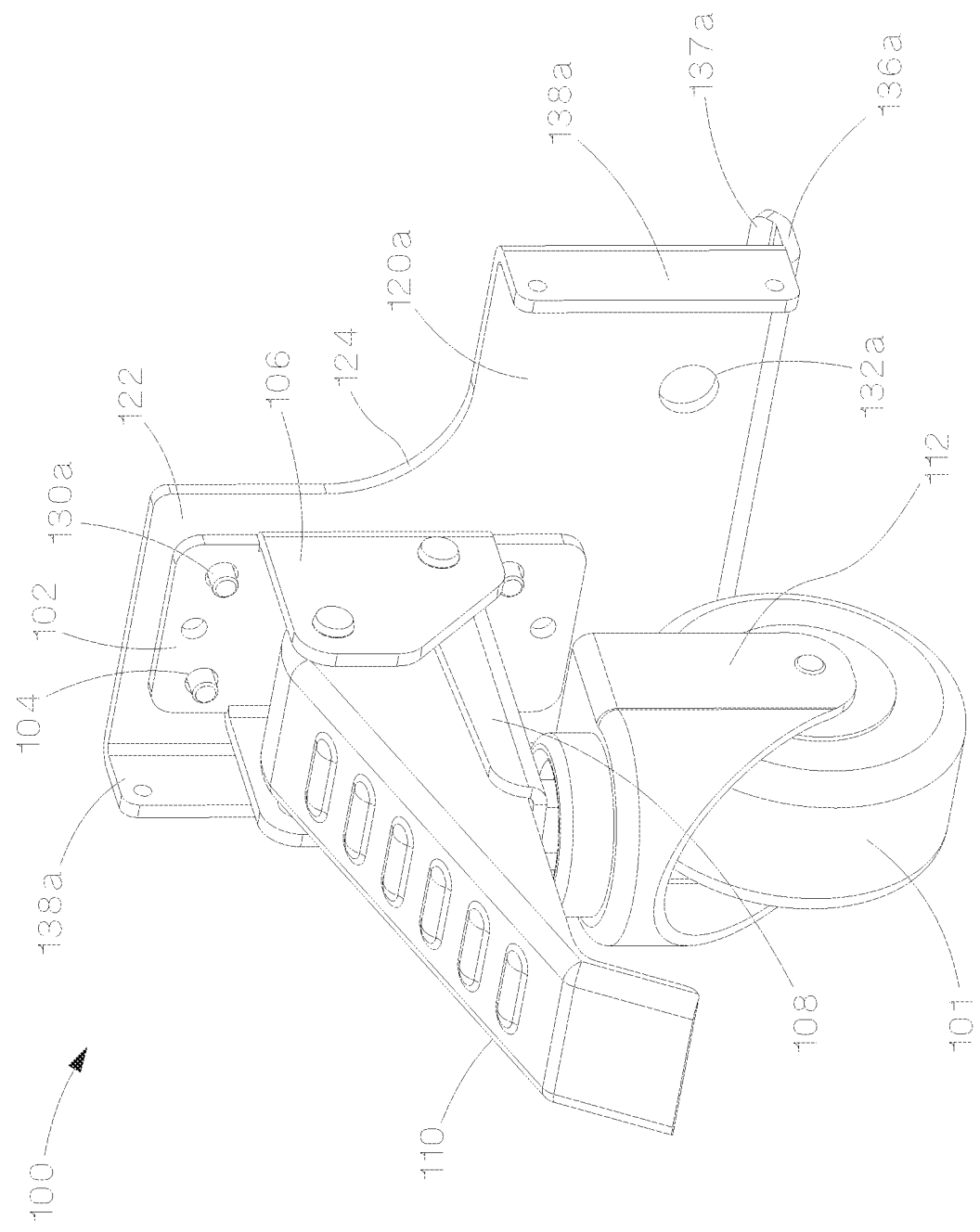
FIG. 3 is a perspective view of the transport caster assembly of the present invention.

FIG. 3 illustrates the transport caster assembly 100. The transport caster assembly 100 is designed to be offset from the mounting point on the cabinet 50. This provides an installer with easy access to mounting locations on the data center cabinet 50. The transport caster assembly 100 includes a transport caster 101 and a transport caster bracket 120a, 120b that secures the transport caster 101 to the data center cabinet 50. The transport caster 101 includes a mounting plate 102, a mounting bracket 106 extending from the mounting plate, and a lifting plate 108. A lifting lever 110 is pivotally connected to the mounting bracket 106 and the lifting plate 108 is pivotally connected to the mounting plate 102. A wheel assembly 112 is mounted to the lifting plate 108. The mounting bracket 106 is mounted to the transport caster bracket 120.

The transport caster bracket 120a, 120b is designed with an offset portion 122 to the left side for the right side bracket 120 a and with an offset portion 126 to the right side for a left side bracket 120b. The transport caster brackets 120a, 120b include threaded inserts 130a, 130b that are installed through the holes 104 in the mounting plate 102. The transport caster brackets 120a, 120b also include a mounting hole 132a, 132b for receiving a knob 140 to secure the transport caster bracket 120a, 120b to the cabinet 50 (see FIGS. 4-7). The mounting hole 132a, 132b is located adjacent to the offset portion 122, 126 of the bracket 120a, 120b to provide easy access to the mounting hole 132a, 132b which facilitates the installation of the brackets 120a, 120b. Moving the transport caster assembly 100 towards the center of the cabinet 50 also provides better clearance between the cabinet's equipment rails 84 and the lifting lever 110 of the transport caster assembly 100. The transport caster brackets 120a, 120b also include a cutout area 124, 128 adjacent to the offset portions 122, 126, respectively, for providing an additional passageway to route cables.

Figure 10:
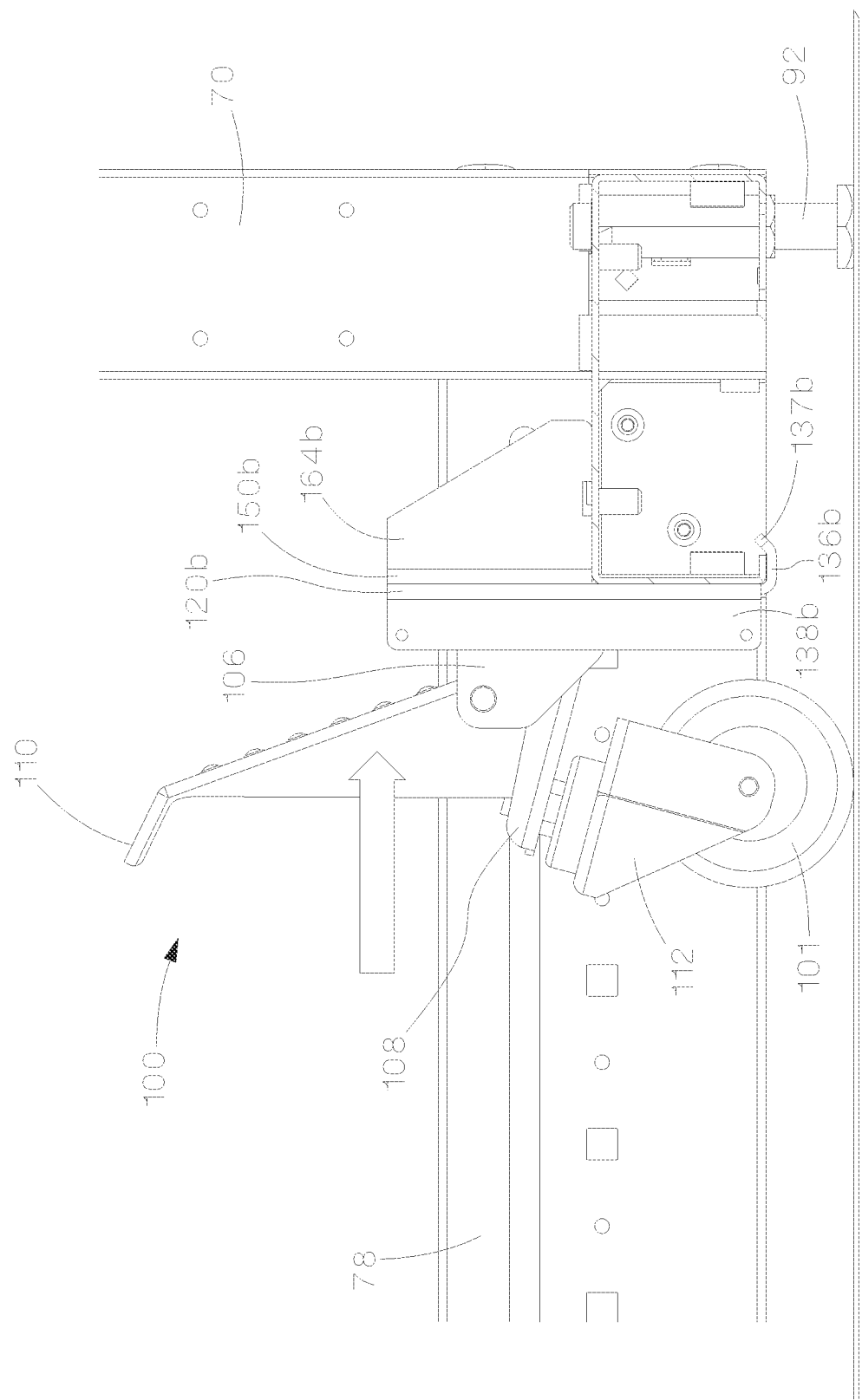
FIG. 10 is a side view of the left transport caster assembly of FIG. 5 with a backing plate and the lifting lever in the upright position.
Figure 11:
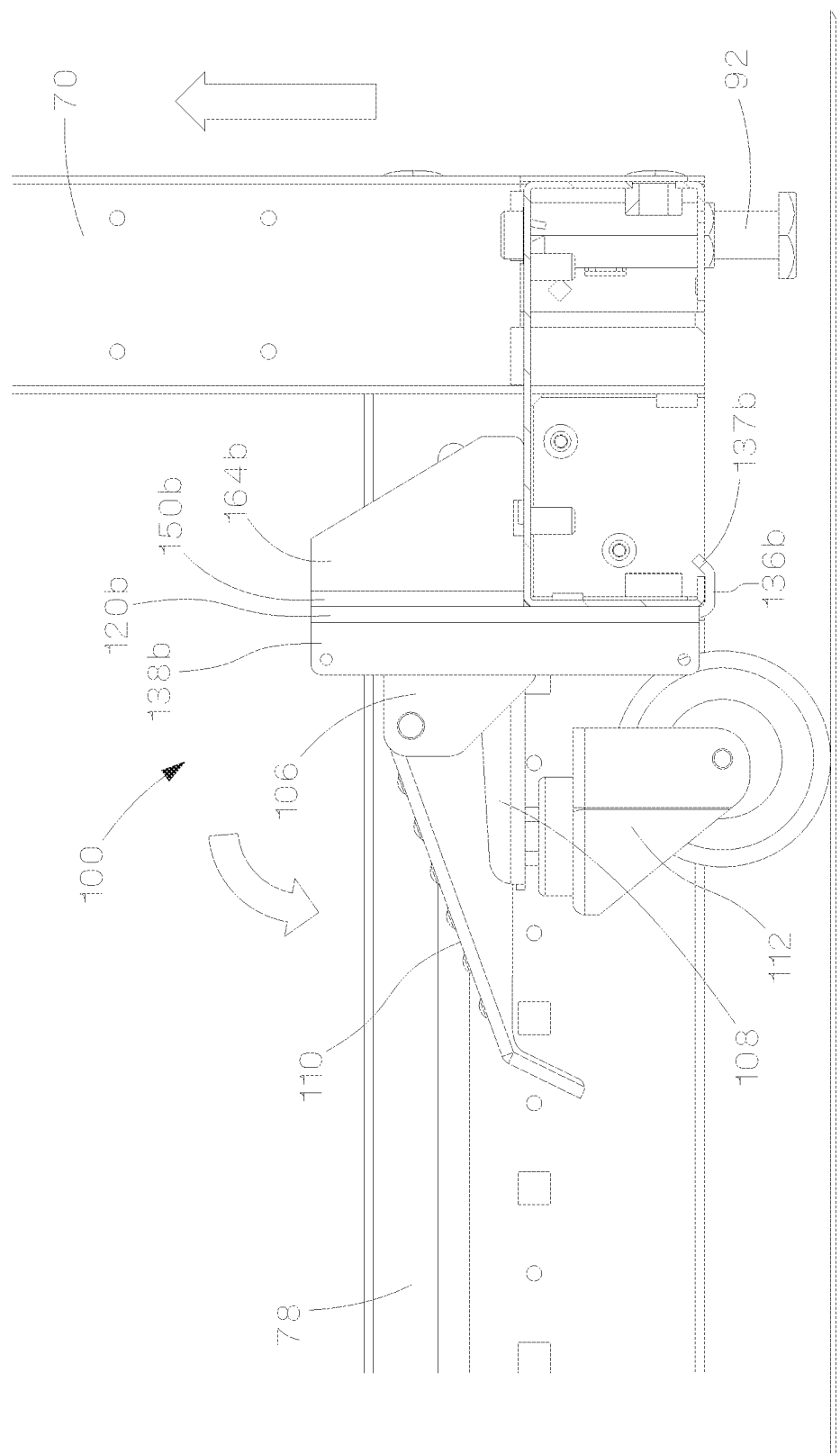
FIG. 11 is a side view of the transport caster assembly of FIG. 10 with the lifting lever in the lowered position.

A lifting flange 136a, 136b extends from the bottom of the rear of the transport caster brackets 120a, 120b. The lifting flange 136a, 136 b has a distal end 137a, 137b extending upwards at an angle away from the transport caster bracket. The lifting flange 136a, 136b is used to support the weight of the cabinet 50 when lifted off the ground. The lifting flange 136a, 136b needs to have a low profile to allow it to fit under the side to side beam 64, 72 of the cabinet 50. As illustrated in FIGS. 10-11, the lifting flange 136a, 136b is positioned under the side to side beam 64, 72 of the data center cabinet 50. Side wings 138a, 138b extend from the sides of the transport caster bracket 120a, 120b in a direction opposite the lifting flange 136a, 136b.

Figure 4:
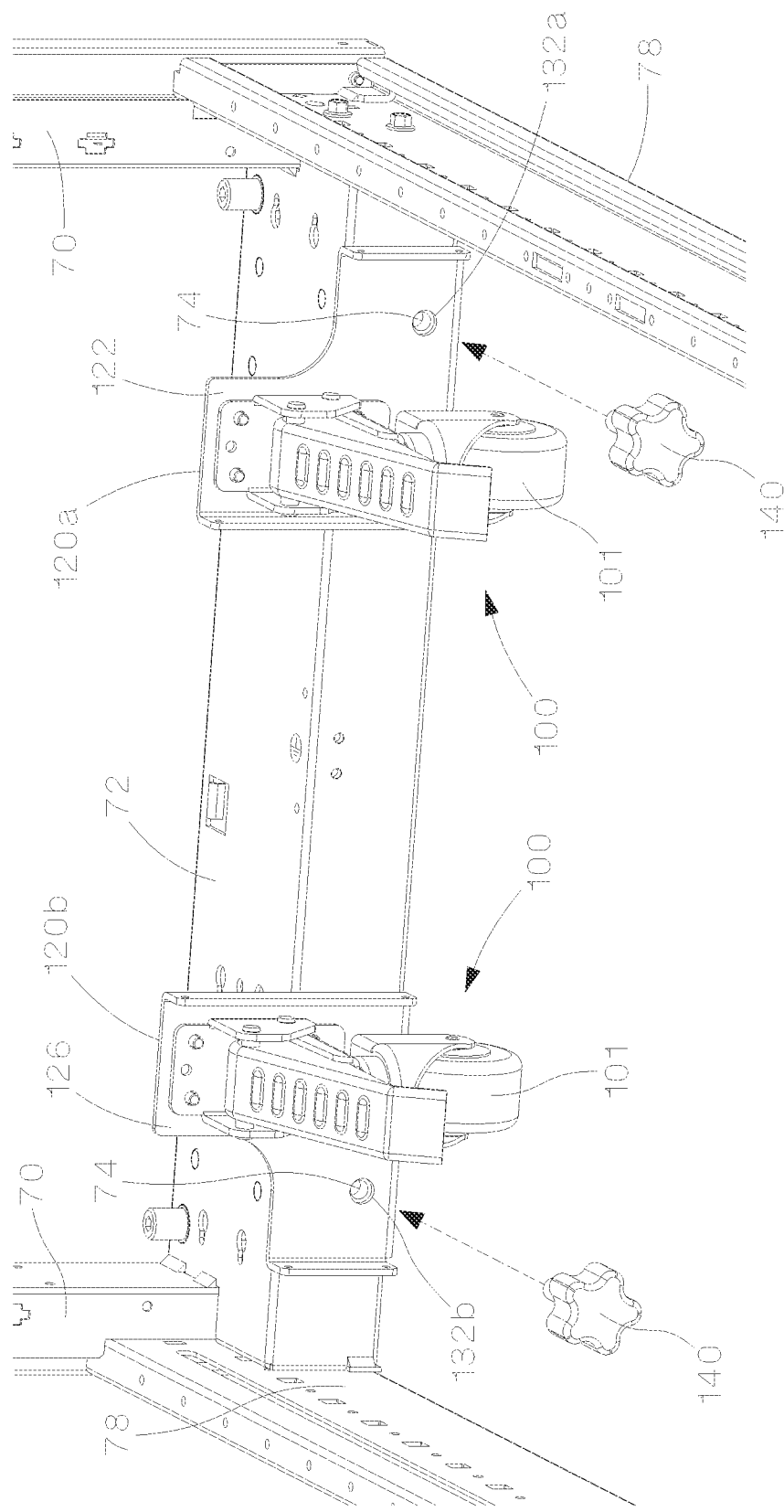
FIG. 4 is a partially exploded view of the transport caster assembly of FIG. 3 positioned to be installed on the rear side to side beam in the data center cabinet.

FIG. 4 illustrates the transport caster assemblies 100 positioned adjacent to the side to side beam 72 of the data center cabinet 50 prior to mounting. Although only the rear or back side to side beam is illustrated, the transport caster assemblies 100 are secured to the front side to side beam in the same fashion. As illustrated, the transport caster assembly 100 includes a transport caster bracket 120a with an offset portion 122 for the right side of the cabinet and a transport caster bracket 120b with an offset portion 126 for the left side of the cabinet 50. The transport caster brackets 120a, 120b are positioned with the mounting holes 132a, 132b aligned with holes 74 in the back side to side beam 72.

As illustrated in FIG. 4, a mounting knob 140 is positioned to be inserted through the mounting hole 132a, 132b in the transport caster bracket 120a, 120b and the hole 74 in the back side to side beam 72 to secure the transport caster assembly 100 to the cabinet 50. The offset portions 122, 126 of the transport caster brackets 120a, 120b enable the installer to easily access the mounting knobs 140 to secure the transport caster assembly 100 to the cabinet 50. The mounting knobs 140 are tightened by hand thereby eliminating the need for tools to install the transport caster assemblies 100.

Figure 5:
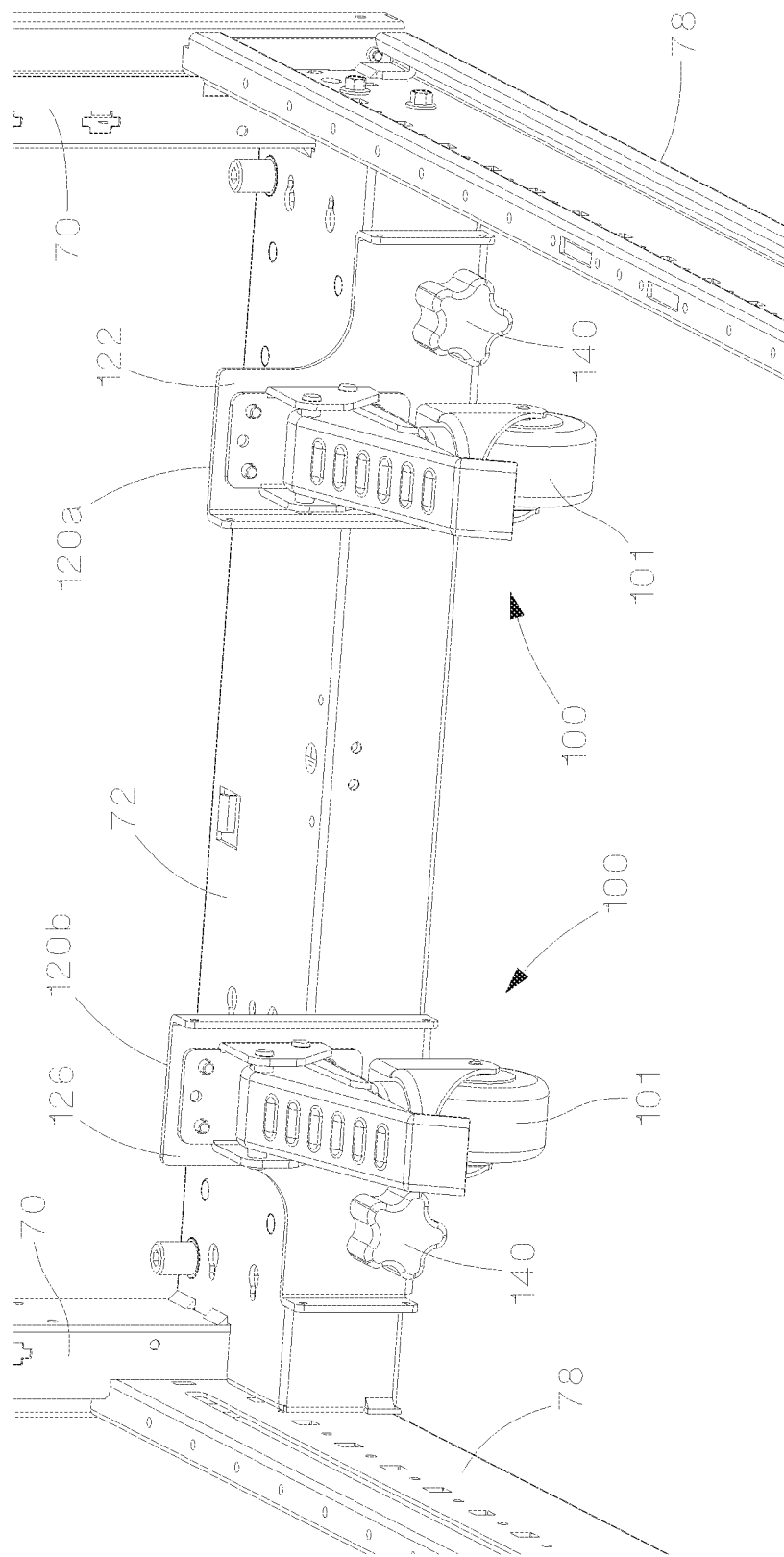
FIG. 5 is a perspective view of the transport caster assembly of FIG. 3 installed on the rear side to side beam in the data center cabinet.
Figure 6:
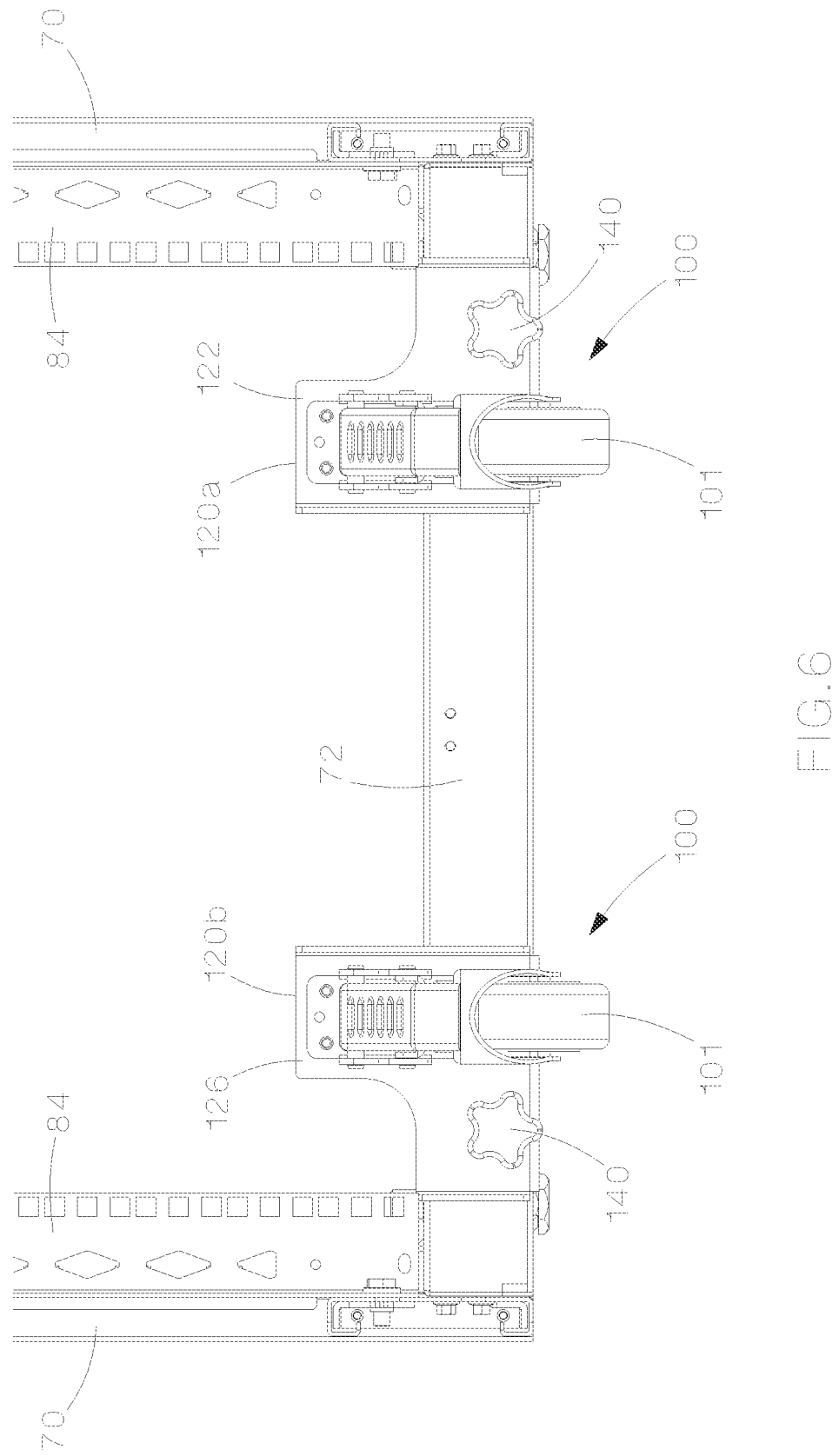
FIG. 6 is a front view of the transport caster assembly of FIG. 3 installed on the rear side to side beam of a 600 mm wide cabinet.
Figure 7:
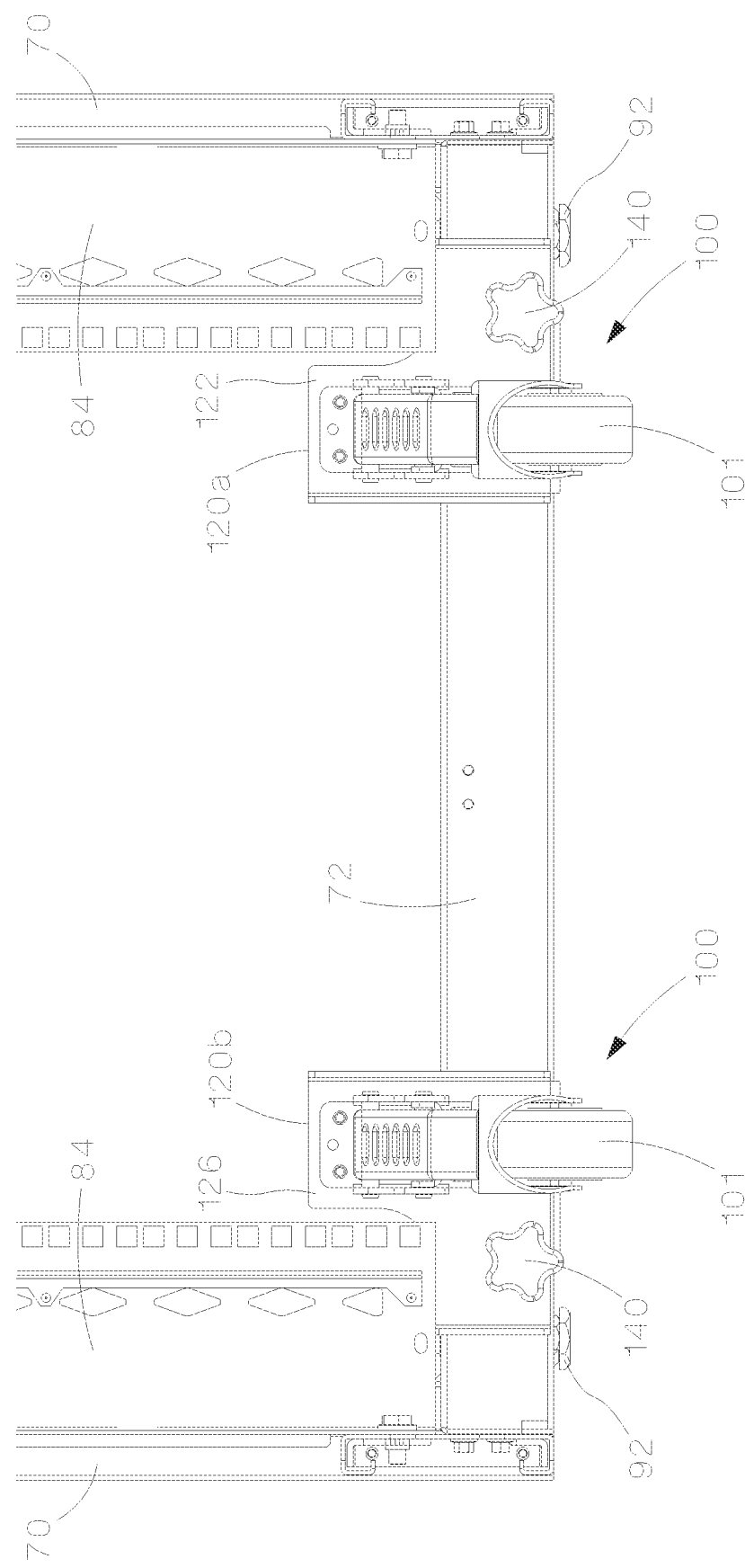
FIG. 7 is a front view of the transport caster assembly of FIG. 3 installed on the rear side to side beam of a 700 mm wide cabinet.
Figure 8:
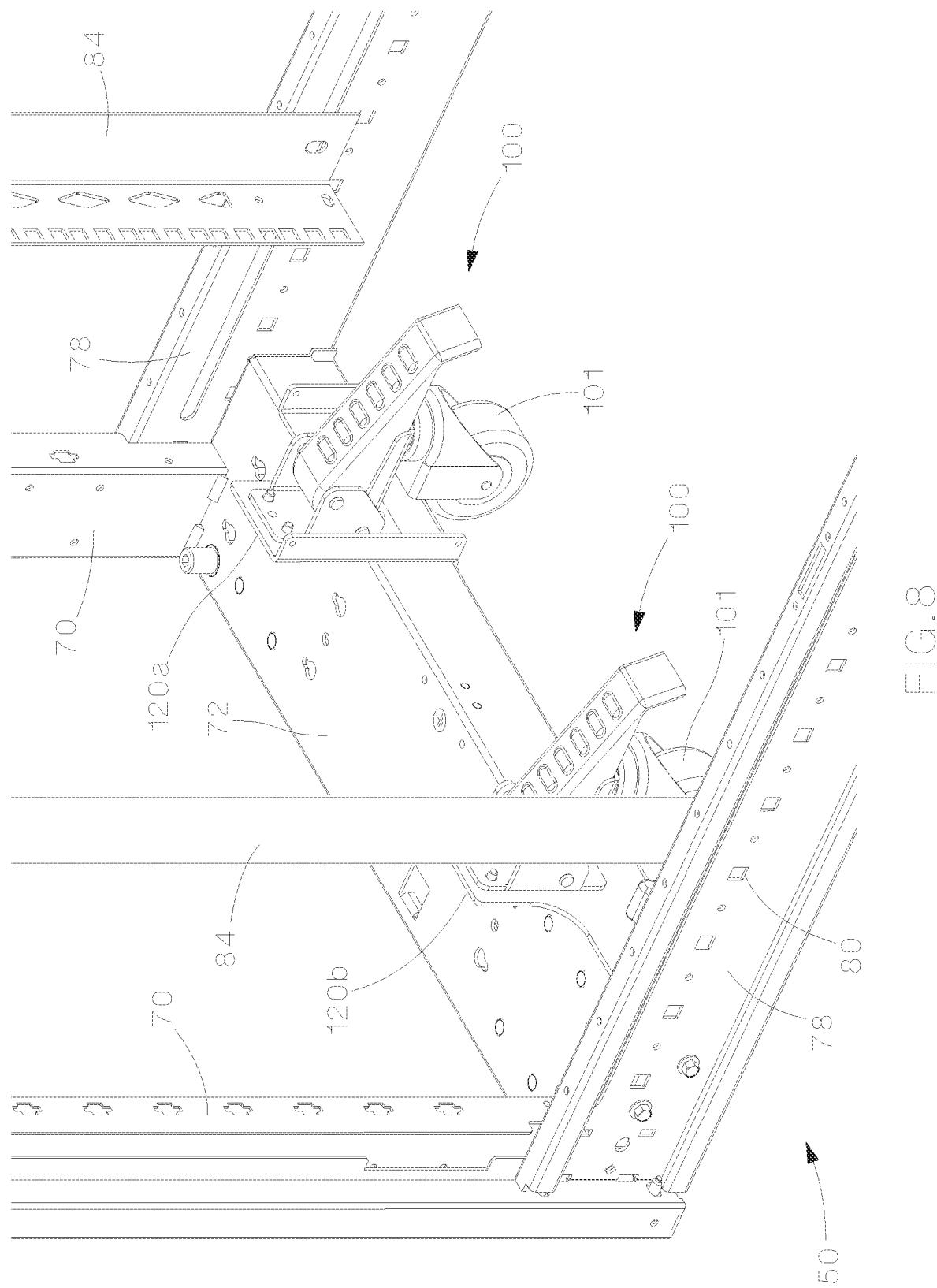
FIG. 8 is a top perspective view of the transport caster assembly installed on the rear side to side beam of FIG. 6.

FIGS. 5-8 illustrate the transport caster assembly 100 installed on the cabinet 50. FIGS. 5, 6, and 8 illustrate the transport caster assembly 100 installed on a 600 mm wide cabinet. The transport caster bracket 120a, 120b positions the transport caster 101 away from the equipment rails 84 to allow the lifting lever 110 to be activated without interfering with the equipment rails 84. The transport caster assembly 100 can also be used on different sized cabinets 50. FIG. 7 illustrates the transport caster assembly 100 installed on 700 mm wide cabinet. The transport caster bracket 120a, 120b provides the necessary clearance between the lifting lever 110 of the transport caster 101 and the equipment rail 84.

As illustrated in FIGS. 9-13, a backing plate 150a, 150b may also be added to the transport caster assembly to improve the rigidness of the transport caster assembly 100. The backing plate 150a, 150b is a separate component that is installed on the side to side beam 64, 72 of the cabinet 50. The backing plates 150a, 150b reside behind the transport caster brackets 120a, 120b, respectively. This arrangement helps reduce the deflection on the transport caster brackets 120a, 120b under heavier loads.

Figure 13:
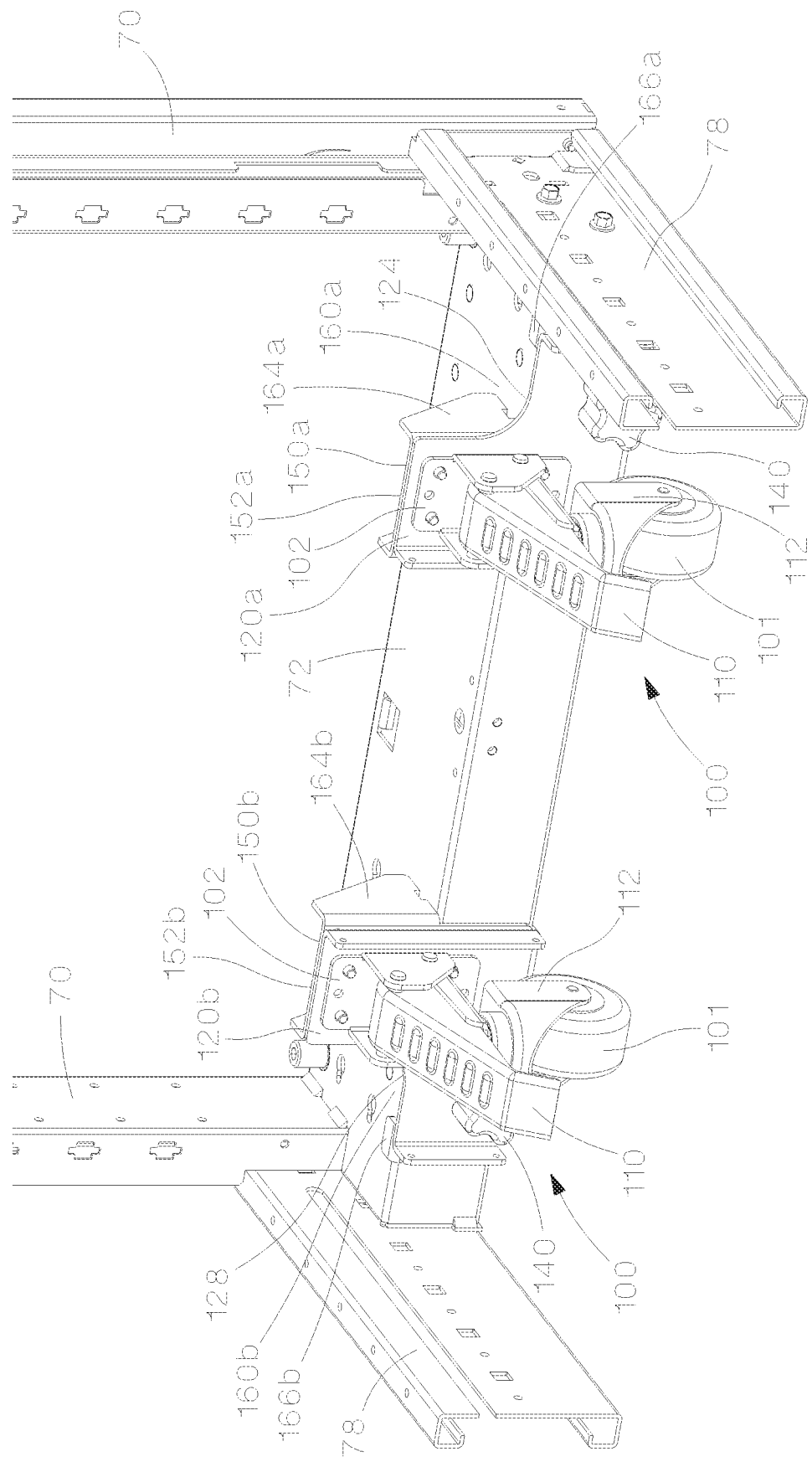
FIG. 13 is a perspective view of the left and right transport caster assemblies of FIG. 5 with backing plates installed on the rear side to side beam.

As illustrated in FIG. 13, the backing plates 150a, 150b are also designed specifically for the right side and the left side of the cabinet. The backing plate 150a, 150b includes a generally L shaped main member 152a, 152b with a mounting hole 162a, 162b for receiving the mounting knob 140. The backing plates 150a, 150b include a cutout area 160a, 160b that corresponds to the cutout areas 124, 128 of the transport caster brackets 120a, 120b, respectively.

The backing plate 150a, 150b also includes two buttress 164a, 164b that extend from the sides 156a, 156b of the main member 152a, 152b. The backing plate 150a, 150b also includes a tab 166a, 166b that extends from the top 154a, 154b of the cut out area 160. The two buttresses 164 and the tab 166 extend in the same direction backwards away from the main member 152a, 152b.

Figure 9:
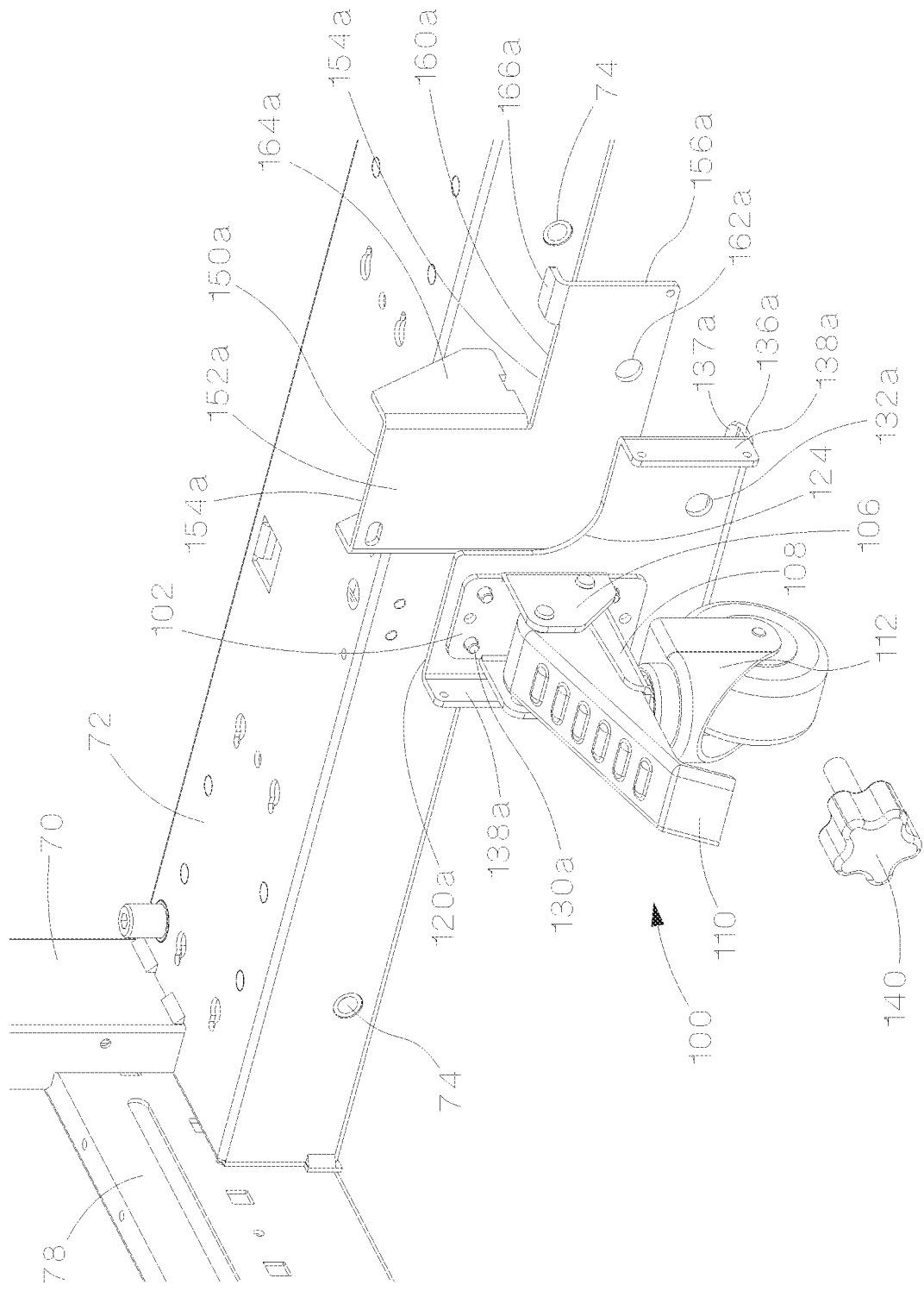
FIG. 9 is an exploded view of the transport caster assembly of FIG. 3 with a backing plate positioned to be installed on the rear side to side beam.

FIG. 9 illustrates a backing plate 150a and a transport caster assembly 100 positioned to be installed on the side to side beam 64, 72 of the cabinet 50. The hole 162a in the backing plate 150a and the hole 132a in the transport caster bracket 120a align to receiving the mounting knob 140.

The transport caster assemblies 100 are installed on cabinets that are on the ground or cabinets that are support by leveling legs. The transport caster assemblies 100 are installed with the lifting lever 110 in the upright position (see FIG. 10). The transport caster assembly 100 is slid toward the side to side beam 64, 72 positioning the lifting flange 136a, 136b under the cabinet 50. When the lifting lever 110 is in the raised position the cabinet or leveling legs 92 rest on the ground. No load is on the wheel assembly 112 of the transport caster 101 in this position. Once the transport caster assembly 100 has been positioned, the installer secures the transport caster bracket 120a, 120b with the mounting knob 140.

After the transport caster assemblies are secured, the lifting levers 110 may be activated. To lift the cabinet 50 off the ground the installer presses down on the lifting lever 110, typically with their foot. The lifting lever 110 works like a cam and presses down on the lifting plate 108. The cam surface of the lifting lever 110 pushes the lifting plate 108 down thereby lifting the cabinet 50 off of the floor. Once all of the lifting levers 110 are locked into position, the cabinet 50 may be rolled to the desired location. Once in the desired location, each lifting lever 110 is raised to release the transport caster assembly 100 and the cabinet 50 is placed back on the ground or the leveling legs 92. The transport caster assemblies 100 can be removed to be used on another cabinet.

Figure 12:
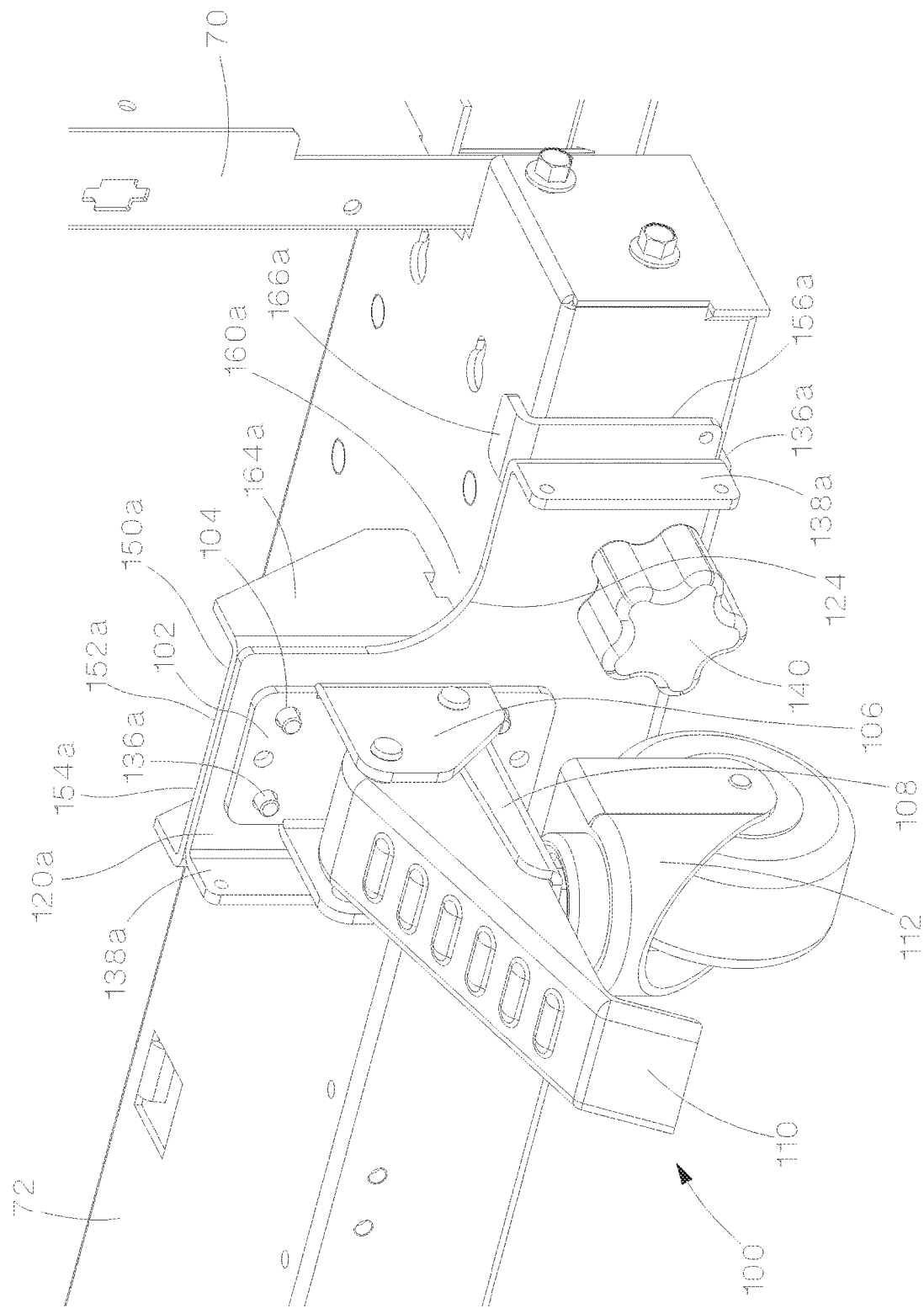
FIG. 12 is a perspective view of the right transport caster assembly and backing plate of FIG. 9 installed on the rear side to side beam.

FIGS. 12 and 13 illustrate the backing plate 150a, 150b and transport caster assembly 100 fully installed on the cabinet 50. The transport caster bracket lifting flange 136a, 136b still supports most of the cabinet weight, however, the buttress 164a, 164b of the backing plate 150a, 150b transfers some of the load to the side to side beam 64, 72 of the cabinet 50. The small tab 166a, 166b on the backing plate 150a, 150b prevents the backing plate 150a, 150b from rotating about the mounting point when under load.

Figure 14:
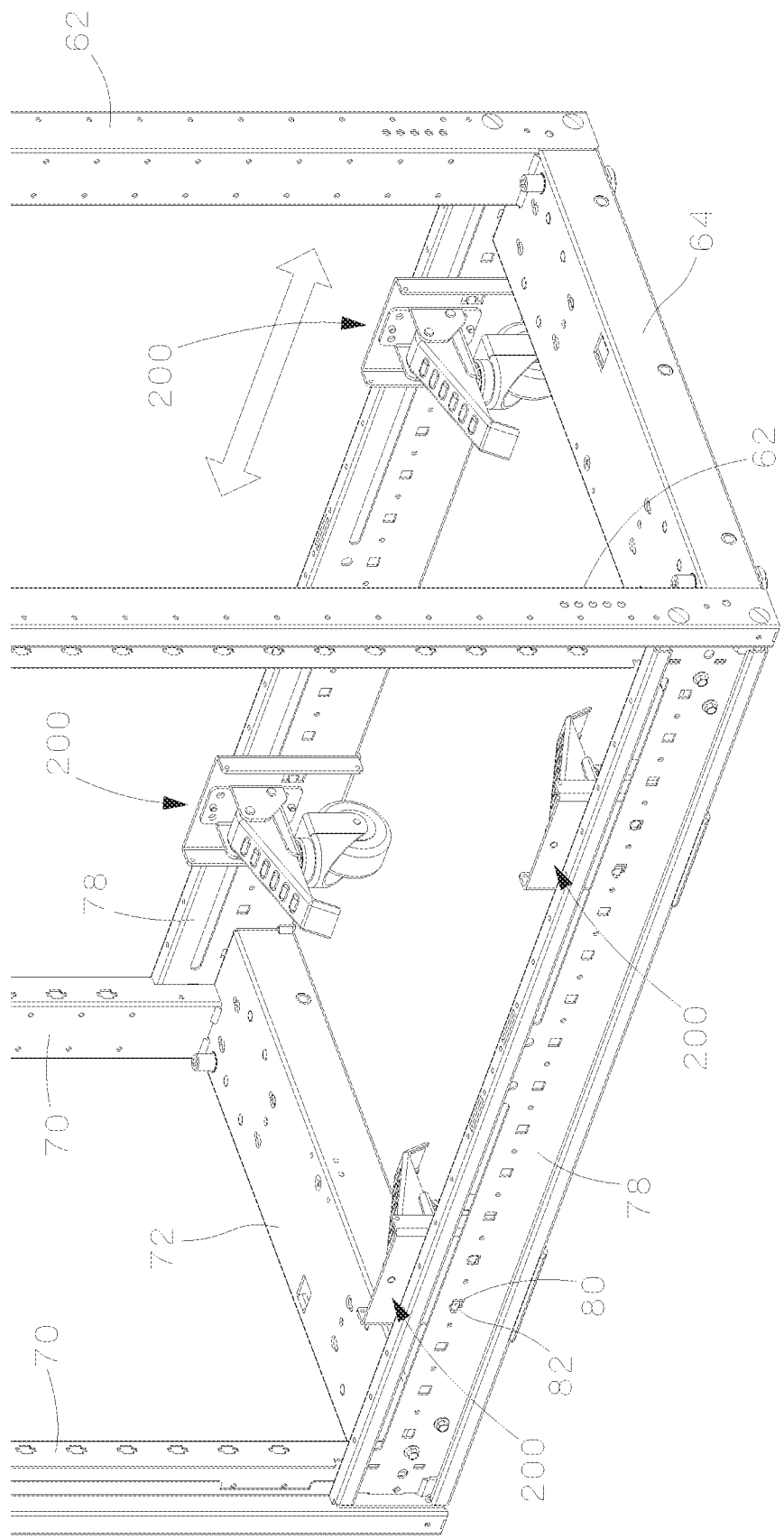
FIG. 14 is a perspective view of an alternative transport caster assembly secured to the front to back beam of a data center cabinet.
Figure 15:
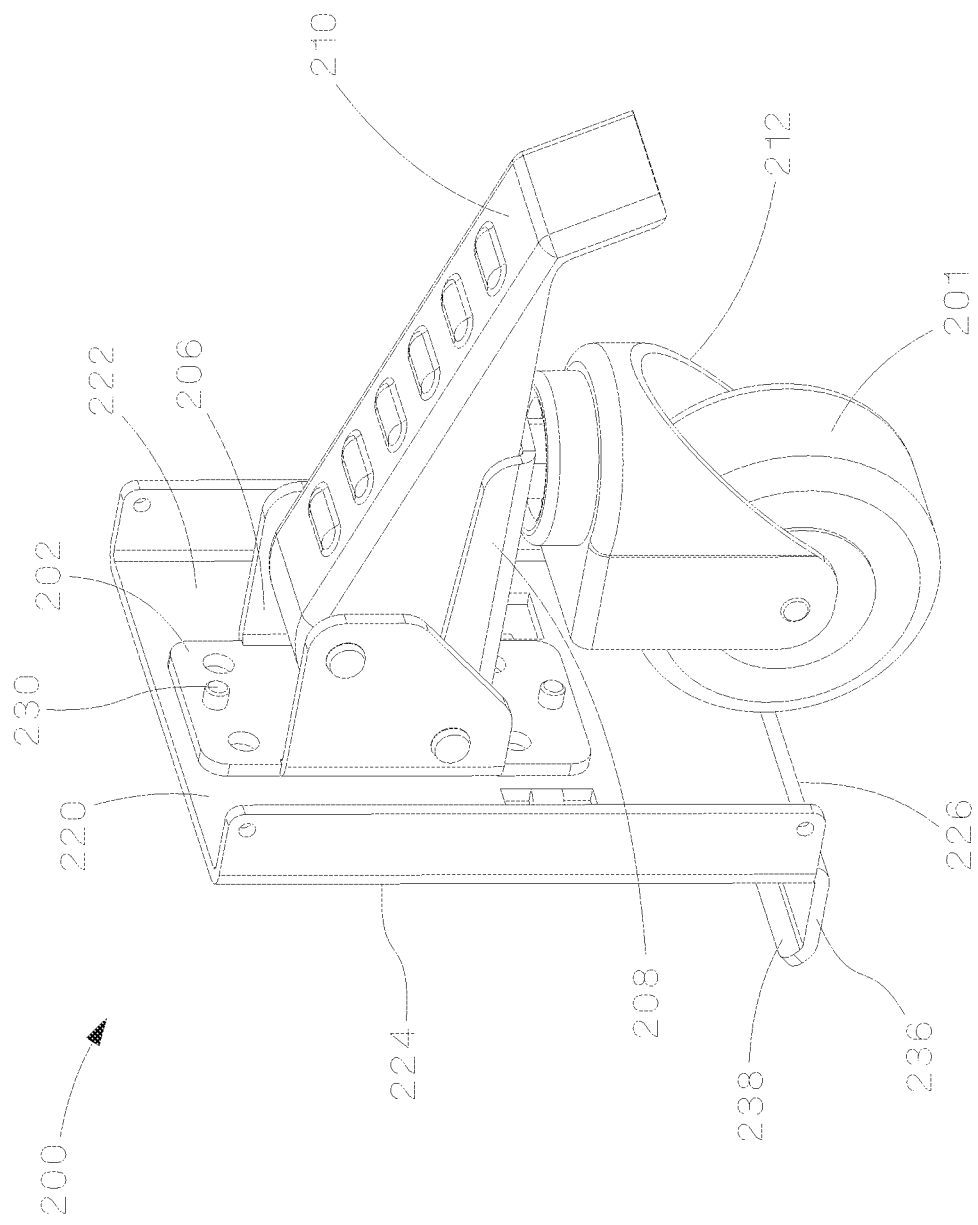
FIG. 15 is a front perspective view of the transport caster assembly of FIG. 14.
Figure 16:
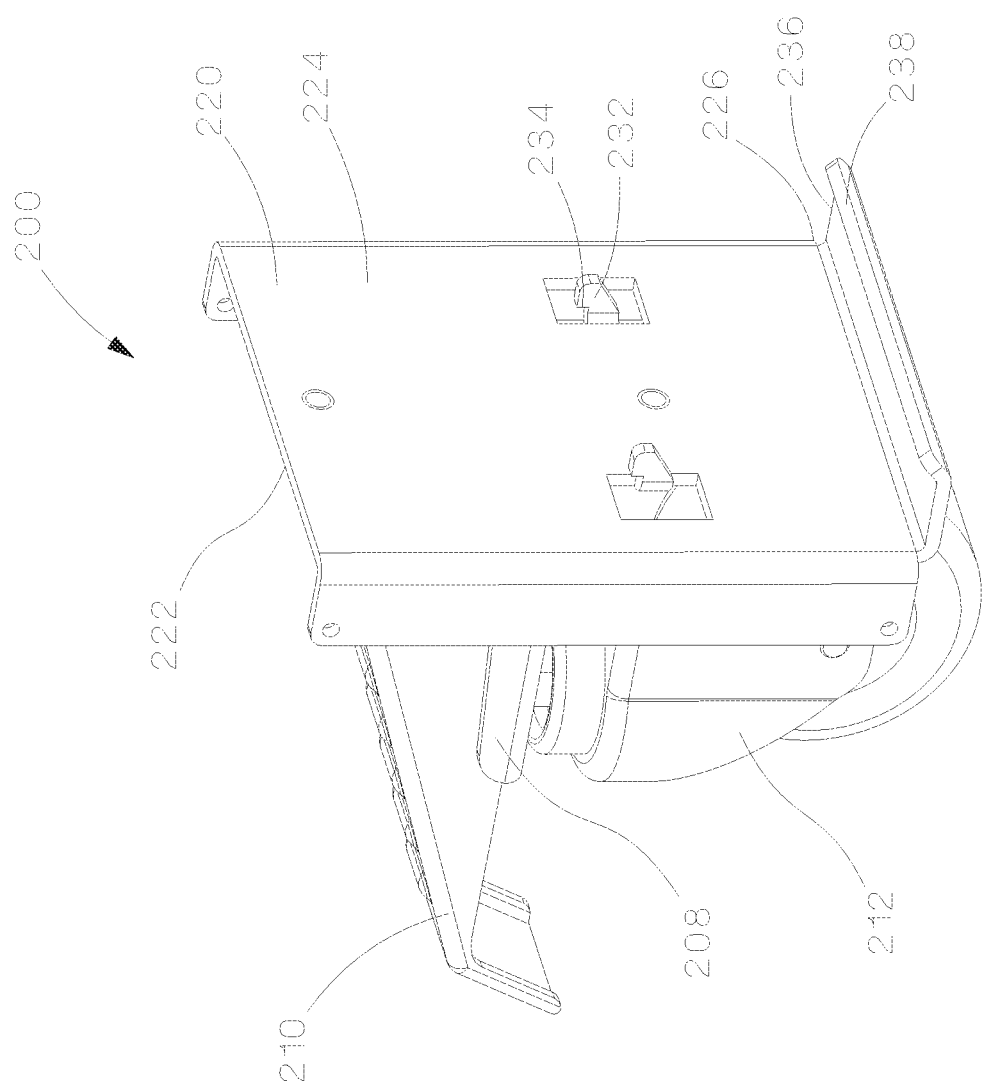
FIG. 16 is a rear perspective view of the transport caster assembly of FIG. 14.

FIG. 14 illustrates an alternative transport caster assembly 200 secured to a front to back beam 78 in a data center cabinet 50. The transport caster assembly 200 may be installed in a variety of locations along the front to back beams 78. FIGS. 15 and 16 illustrate the alternate transport caster assembly 200. The transport caster assembly 200 includes a transport caster 201 with a mounting plate 202, a mounting bracket 206, a lifting plate 208, a lifting lever 210 and a wheel assembly 212 and a transport caster bracket 220. The mounting plate 202 is secured to the front of the transport caster bracket 220 by threaded inserts 230 extending from the front 222 of the transport caster bracket 220 and mounting nuts (not illustrated). As illustrated in FIG. 16, the rear 224 of the transport caster bracket 220 includes formed hooks 232 that are designed to pass through and latch onto the cage nut holes 80 in the front to back beam 78 of the cabinet 50. The transport caster bracket 220 also includes a lifting flange 236 extending from the bottom 226 of the transport caster bracket 220. The lifting flange 236 extends away from the bracket 220 in a direction opposite of the lifting lever 210 and wheel assembly 212. The lifting flange 236 extends horizontally with the distal end 238 extending upwards at an angle away from the transport caster bracket 220. When the transport caster assembly 200 is installed on the front to back beam 78 of the cabinet 50, the lifting flange 236 is positioned under the front to back beam 78 to help support the weight of the cabinet 50.

Figure 17:
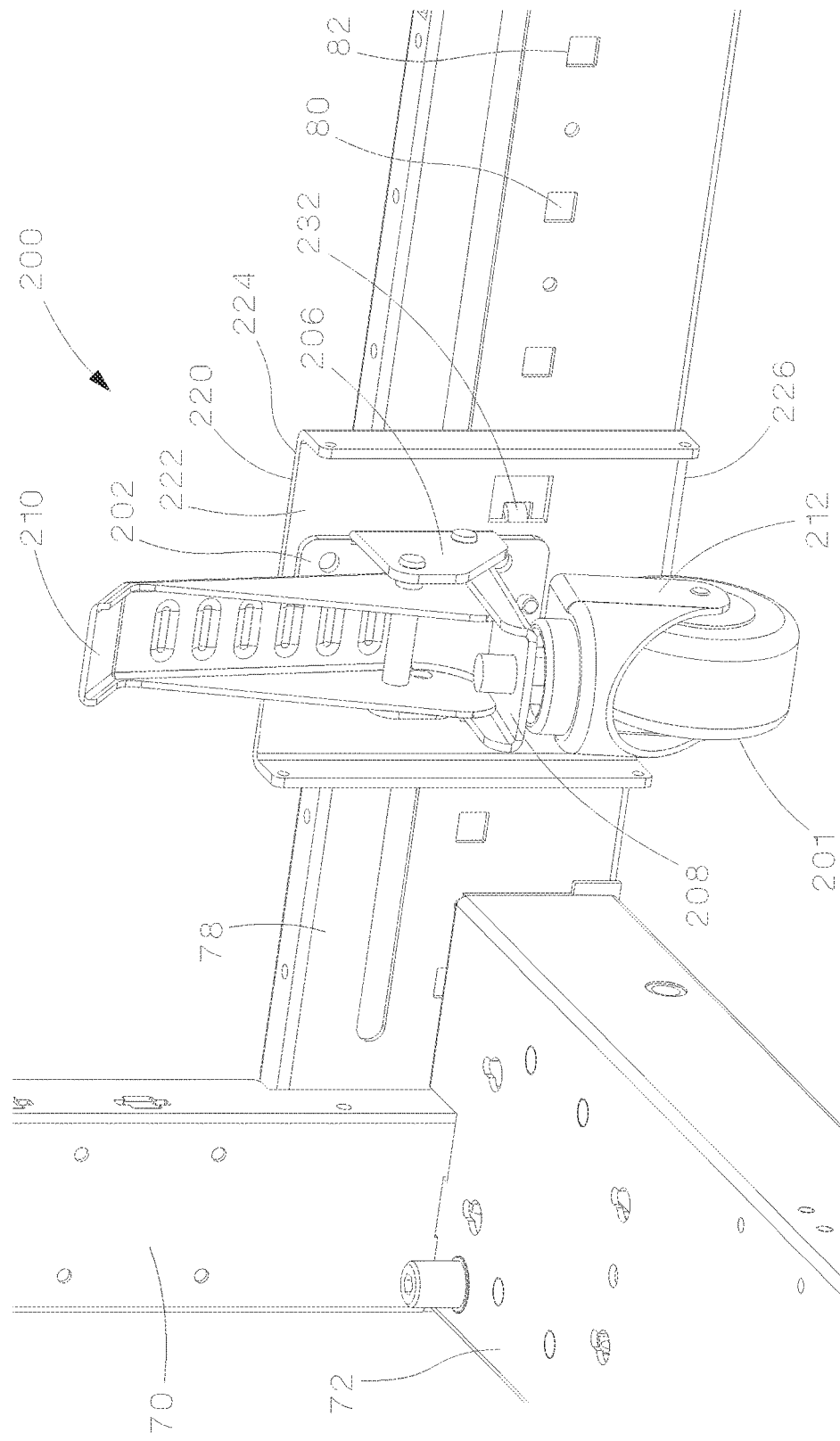
FIG. 17 is a front perspective view of the transport caster assembly of FIG. 14 being installed on a front to back beam of the data center cabinet.

The transport caster assembly 200 is designed to be installed on the front to back beam 78 without any tools or fasteners. FIGS. 17-22 illustrate the transport caster assembly 200 being inserted in the front to back beam 78. As illustrated in FIG. 17, the hooks 232 extending from the transport caster bracket 220 are aligned with the cage nut holes 80 on the front to back beam 78 of the cabinet 50. The cage nut holes 80 extend the length of the front to back beam 78 thereby providing the installer with versatility in selecting the placement for the transport caster assembly 200. The installer slides the hooks 232 through the cage nut holes 80. In this position, the lifting flange 236 extending from the transport caster bracket 220 can easily pass under the front to back beam 78 of the cabinet 50. FIG. 18 illustrates the installation of the transport caster bracket 220 from outside of the cabinet. The hooks 232 have a small edge 234 (See FIG. 19) that is designed to catch the top 82 of the cage nut hole 80 when the transport caster assembly 200 is lifted. As a result, the hooks 232 prevent the transport caster bracket 220 from slipping out of the holes 232 when the cabinet 50 is lifted.

Figure 20:
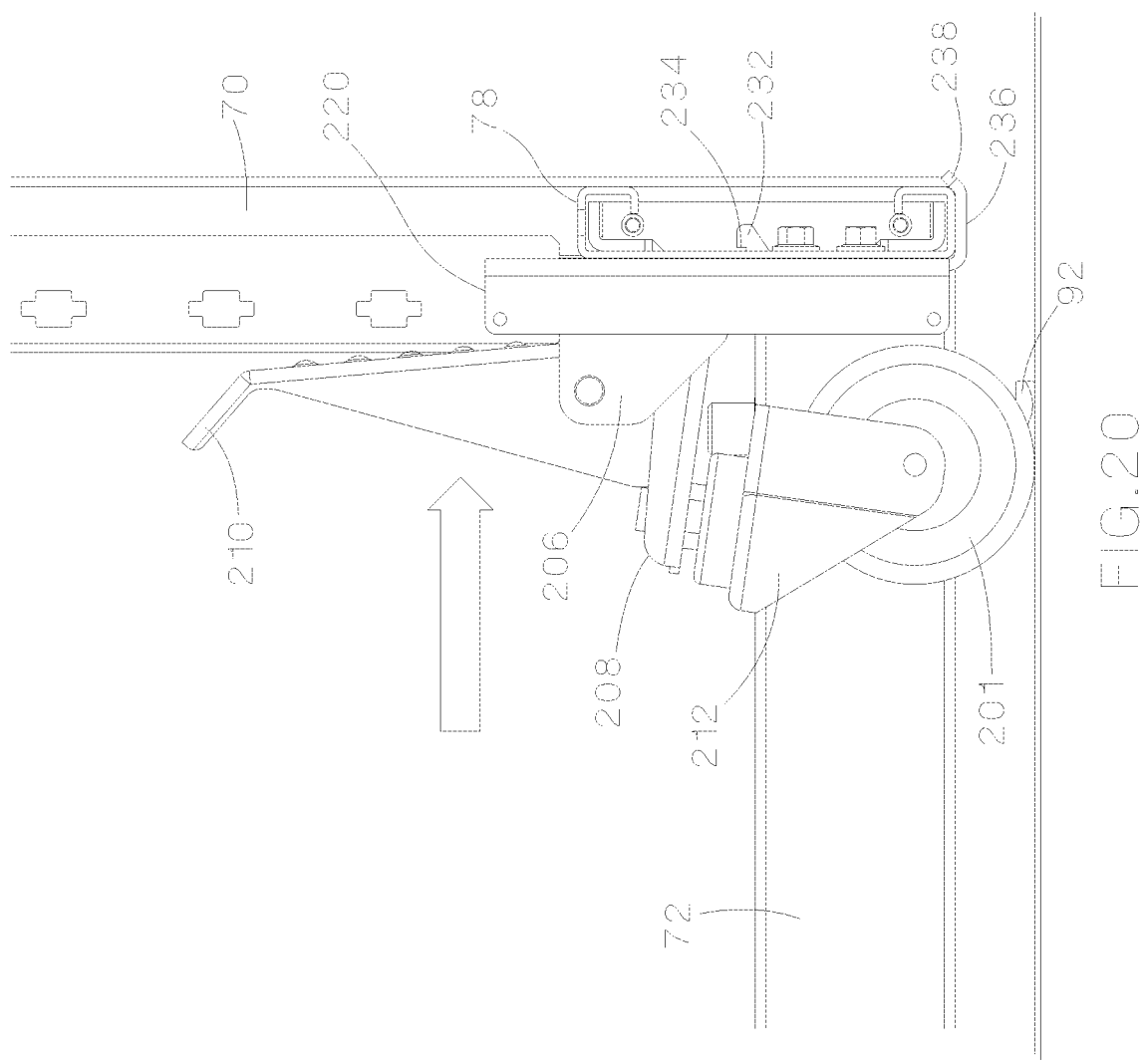
FIG. 20 is a side view of the transport caster assembly of FIG. 17 with the lifting lever in an upright position.

FIGS. 20-22 illustrate the sequence of activating the lifting lever 210 of the transport caster assembly 200 to install the transport caster assembly 200 in the front to back beam 78 of the cabinet 50. As illustrated in FIG. 20, the cabinet leveling legs 92 are supporting the cabinet 50 on the floor. The hooks 232 on the transport caster bracket 220 are aligned with the cage nut hole 80 on the front to back beams 78 and the transport caster assembly 200 is slid forward. The hooks 232 pass through the cage nut holes 80 in the front to back beam 78 and the lifting flange 236 is slid under the front to back beam 78 of the cabinet 50. Once positioned, the installer pushes down on the lifting lever 210 and the cabinet 50 is raised off the floor (See FIG. 21). The transport caster lifting flange 236 lifts and supports the cabinet 50. Distal end 238 hooks under the front to back beam 78 to prevent the lifting flange 236 from sliding out from under the cabinet. As illustrated in FIGS. 21 and 22, the edge 234 on the hook 232 catches the cage nut hole 80 of the front to back beam 78 to prevent the transport caster bracket 220 from sliding out of the cage nut hole 80. The remaining transport caster assemblies 200 (typically four per cabinet) are installed in the same manner. After all of the desired transport caster assemblies 200 are installed and the cabinet 50 is raised off of the floor, the cabinet 50 may be moved to the desired location. Once the cabinet 50 has been relocated, the lifting levers 210 are raised thereby lowering the cabinet 50 to be supported by the leveling legs 92. The transport caster assemblies 200 may be removed and installed on another cabinet 50 that requires relocation.

Furthermore, while the particular preferred embodiments of the present invention have been shown and described, it will be obvious to those skilled in the art that changes and modifications may be made without departing from the teaching of the invention. The matter set forth in the foregoing description and accompanying drawings is offered by way of illustration only and not as limitation. The actual scope of the invention is intended to be defined in the following claims when viewed in their proper perspective based on the prior art.

What is claimed is:

1. A data center cabinet comprising:
 a base frame with front vertical posts connected by front side to side beams and back vertical posts connected by back side to side beams;
 front to back beams connecting the front vertical posts to the back vertical posts; and
 transport caster assemblies removably secured to one of the side to side beams and the front to back beams for facilitating the relocation of the data center cabinet;
 wherein the transport caster assemblies comprising a transport caster having a mounting plate, a mounting bracket extending from the mounting plate, a lifting plate pivotally connected to the mounting plate, a lifting lever pivotally connected to the mounting bracket and a wheel assembly; and a transport caster bracket secured to the transport caster, whereby the transport caster bracket secures the transport caster to one of the side to side beams and the front to back beams of the cabinet.

2. The data center cabinet of claim 1, wherein the transport caster bracket having an offset portion with a mounting hole adjacent the offset portion for receiving a fastener to secure the transport caster bracket and wherein the transport caster bracket having a cutout area for providing a passageway to route cables in the cabinet.

3. The data center cabinet of claim 2, further comprising a backing plate for increasing the rigidness of the transport caster assembly, wherein the backing plate having a main member with an offset portion complementing the offset portion of the transport caster bracket and a mounting hole for receiving a fastener to secure the backing plate to the cabinet.

4. The data center cabinet of claim 1, the transport caster bracket having threaded inserts extending from a front of the transport caster bracket and extending through holes in the mounting plate of the transport caster.

5. The data center cabinet of claim 1, wherein the transport caster bracket having a lifting flange extending from the bottom rear of the transport caster bracket, whereby the lifting flange is positioned under the cabinet for supporting the cabinet when lifted to be relocated.

6. The data center cabinet of claim 1, wherein the transport caster bracket having threaded inserts extending from a front of the transport caster bracket and extending through holes in the mounting plate of the transport caster; and formed hooks extending from the rear of the transport caster bracket for engaging cage nut holes in the front to back beam in the cabinet.

7. The data center cabinet of claim 6, wherein the formed hooks have a small edge for engaging a top of the cage nut holes in the front to back beam in the cabinet.

8. The data center cabinet of claim 6, wherein the transport caster bracket having a lifting flange extending from a bottom of the transport caster bracket away from the bracket in a direction opposite the lifting lever of the transport caster, and wherein the lifting flange extends horizontally with a distal end extending upwards at an angle away from the transport caster bracket; whereby the lifting flange is positioned under the cabinet for supporting the cabinet when lifted to be relocated.

* * * * *